US010740529B1

(12) United States Patent
Suresh et al.

(10) Patent No.: US 10,740,529 B1
(45) Date of Patent: Aug. 11, 2020

(54) IMPLEMENTATION OF CIRCUITRY FOR RADIO FREQUENCY APPLICATIONS WITHIN INTEGRATED CIRCUITS

(71) Applicant: Xilinx, Inc., San Jose, CA (US)

(72) Inventors: Avinash Somalinga Suresh, Hyderabad (IN); Narendra Kumar Anumolu, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 12 days.

(21) Appl. No.: 16/180,853

(22) Filed: Nov. 5, 2018

(51) Int. Cl.
 *G06F 30/00* (2020.01)
 *G06F 30/392* (2020.01)
 *H04B 1/40* (2015.01)

(52) U.S. Cl.
 CPC ............. *G06F 30/392* (2020.01); *H04B 1/40* (2013.01)

(58) Field of Classification Search
 CPC ................................ G06F 30/392; H04B 1/40
 USPC .......................................................... 716/122
 See application file for complete search history.

(56) References Cited

U.S. PATENT DOCUMENTS 9,385,798 B1 * 7/2016 Marr ..................... H04B 7/0613
2006/0072014 A1 * 4/2006 Geng ............... G08B 13/19606
  348/159
2006/0074622 A1 * 4/2006 Scott ................... G06F 11/3636
  703/23
2018/0106884 A1 * 4/2018 Marr ....................... G01S 7/292

OTHER PUBLICATIONS

Xilinx, Inc., Vivado Design Suite User Guide, Model-Based DSP Design Using System Generator, User Guide, UG897 (v2018.1), Apr. 4, 2018, Chapter 1, pp. 6-11, San Jose, CA USA.
Xilinx, Inc., "Zynq UltraScale+ RFSoCs," [online} retrieved from the Internet on Oct. 5, 2018: <https://www.xilinx.com/products/silicon-devices/soc/rfsoc.html>, 6 pages, San Jose, CA USA.

* cited by examiner

*Primary Examiner* — Suchin Parihar
(74) *Attorney, Agent, or Firm* — Kevin T. Cuenot

(57) ABSTRACT

Circuit designs and/or circuitry for integrated circuits (ICs) can be generated for radio-frequency (RF) applications by determining, using computer hardware, a value of a parameter of a super-sampling rate (SSR) block within a model of a circuit, wherein the value indicates a number of a plurality of data channels of the SSR block, automatically creating, using the computer hardware, a primary input port and a primary output port for the SSR block based on functionality of the SSR block, wherein vector size of the primary input port and the primary output port is determined from the value of the parameter, automatically creating, using the computer hardware, a plurality of scalar instances of the SSR block based on the value of the parameter, wherein the plurality of scalar instances are arranged in parallel, and configuring, using the computer hardware, each scalar instance of the plurality of scalar instances based on a parameterization of the SSR block.

20 Claims, 7 Drawing Sheets

TECHNICAL FIELD

This disclosure relates to integrated circuits (ICs) and, more particularly, to designing and implementing circuitry in ICs for radio frequency applications.

BACKGROUND

Radio frequency (RF) systems can operate on signals ranging in frequency from approximately 3 kHz to 300 GHz. In modern RF systems, signals are routinely in the gigahertz range. As such, devices within RF systems often include circuitry capable of sampling gigahertz range RF signals. Programmable ICs may be used to perform a wide range of signal processing functions. The programmable circuitry within programmable ICs, however, typically runs at a maximum clock rate that is lower than the sampling rate needed to support RF signal processing. This disparity in operating frequency presents a significant challenge when designing RF systems using programmable ICs.

SUMMARY

In one or more embodiments, a method can include determining, using computer hardware, a value of a parameter of a super-sampling rate (SSR) block within a model of a circuit, wherein the value indicates a number of a plurality of data channels of the SSR block, automatically creating, using the computer hardware, a primary input port and a primary output port for the SSR block based on functionality of the SSR block, wherein vector size of the primary input port and the primary output port is determined from the value of the parameter, automatically creating, using the computer hardware, a plurality of scalar instances of the SSR block based on the value of the parameter, wherein the plurality of scalar instances are arranged in parallel, and configuring, using the computer hardware, each scalar instance of the plurality of scalar instances based on a parameterization of the SSR block.

In one or more embodiments, a system includes a processor. The processor, in response to executing program code, is configured to initiate operations including determining a value of a parameter of an SSR block within a model of a circuit, wherein the value indicates a number of a plurality of data channels of the SSR block, automatically creating a primary input port and a primary output port for the SSR block based on functionality of the SSR block, wherein vector size of the primary input port and the primary output port is determined from the value of the parameter, automatically creating a plurality of scalar instances of the SSR block based on the value of the parameter, wherein the plurality of scalar instances are arranged in parallel, and configuring each scalar instance of the plurality of scalar instances based on a parameterization of the SSR block.

In one or more embodiments, a computer program product includes a computer readable storage medium having program code stored thereon. The program code is executable by a processor to perform operations. The operations can include determining a value of a parameter of an SSR block within a model of a circuit, wherein the value indicates a number of a plurality of data channels of the SSR block, automatically creating a primary input port and a primary output port for the SSR block based on functionality of the SSR block, wherein vector size of the primary input port and the primary output port is determined from the value of the parameter, automatically creating a plurality of scalar instances of the SSR block based on the value of the parameter, wherein the plurality of scalar instances are arranged in parallel, and configuring each scalar instance of the plurality of scalar instances based on a parameterization of the SSR block.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

DETAILED DESCRIPTION

Figure 1:
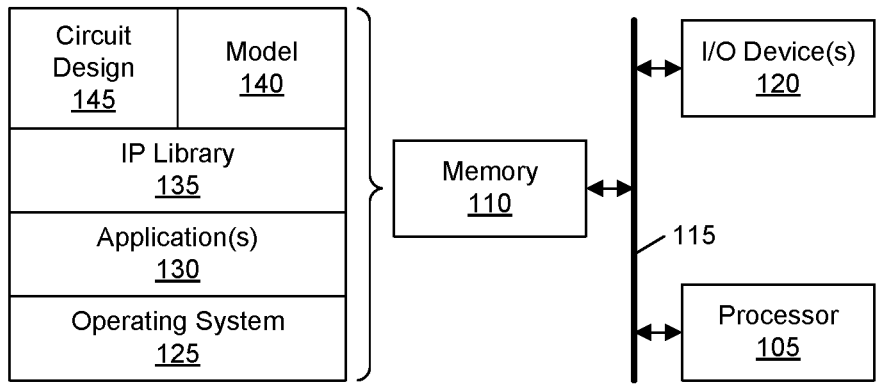
FIG. 1 illustrates a data processing system for use with one or more embodiments described herein.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to designing and implementing circuitry in ICs for radio frequency (RF) applications. RF systems can operate on signals ranging in frequency from approximately 3 kHz to 300 GHz. Modern RF systems routinely handle signals in the gigahertz range. In accordance with the inventive arrangements described within this disclosure, systems and methods are provided that implement model-based techniques for creating circuit designs for RF applications. The methods and systems described herein are also capable of implementing the circuit designs within an IC.

Model-based design environments (hereafter "modeling environments") are suited to create high-quality digital signal processing (DSP) applications. Conventional modeling environments provide a library of design blocks (e.g., "blocks"). The blocks generally correspond to primitives that can be implemented within an IC. The blocks within conventional modeling environments are only capable of receiving scalar samples as input data, processing the scalar samples, and generating scalar samples as output data. These blocks are unable to handle vector, or N-dimensional, I/O data, which limits the usability and capabilities of conventional modeling environments for developing RF applications.

In accordance with one or more embodiments described herein, a model-based design tool is provided that includes an Intellectual Property (IP) library that supports design and implementation of RF applications in programmable circuitry of an IC. The IP library includes one or more multi-channel blocks referred to herein as "super-sampling rate" or "SSR" blocks. Each of the SSR blocks of the IP library represents one or more different operations, e.g., primitives. Unlike blocks of a conventional modeling environment that receive scalars as inputs, operate on scalars, and generate scalars as outputs, the SSR blocks of the IP library are configured to operate on N-dimensional I/O data. The SSR blocks appear to end users as conventional blocks representing primitives, but include an additional parameter referred to as the SSR parameter that specifies a number of channels included in each SSR block.

Serial RF input/output (I/O) data is converted into the N-dimensional I/O data handled by the SSR blocks. Within this disclosure, the term N-dimensional data can be used interchangeably with multi-channel data and vector data. N-dimensional data, for example, is the same as multi-channel data with N channels or vector data with N elements. The SSR blocks are capable of operating on the N-dimensional data generated from the serial RF I/O data. In addition, each of the N-dimensions of the RF I/O data processed by a given SSR block of the IP library has a lower data rate than the original serial RF I/O data from which the N-dimensional I/O data is generated. By splitting the serial RF I/O data into N-dimensions, the programmable circuitry of a programmable IC is able to process the N-dimensional RF I/O data despite having a maximum clock rate that is significantly lower than the sampling rate of the original serial RF I/O data.

The SSR blocks can be inserted into the modeling environment, arranged, and connected to design an electronic system. In general, each of the SSR blocks of a model can be viewed as a subsystem that can be elaborated within the modeling environment to include a plurality of scalar instances of the SSR block where connectivity among the scalar instances with respect to other portions of the model, including other blocks and/or SSR blocks, is automatically implemented.

In particular embodiments, the model, once elaborated within the modeling environment, can be compiled into a circuit design specified in a hardware description language. The circuit design can be processed through a design flow with the result being in a format that can be implemented within an IC. For example, the system created within the modeling environment can be implemented within the programmable circuitry of a programmable IC.

Further aspects of the inventive arrangements are described below in greater detail with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example system 100 for use with one or more embodiments described herein. System 100 is an example of computer hardware that can be used to implement a computer, a server, a portable computer such as a laptop or a tablet computer, or other data processing system. A system or device implemented using computer hardware is capable of performing the various operations described herein relating to implementing RF applications within an IC.

In the example of FIG. 1, system 100 includes at least one processor 105. Processor 105 is coupled to memory 110 through interface circuitry 115. System 100 is capable of storing computer readable instructions (also referred to as "program code") within memory 110. Memory 110 is an example of computer readable storage media. Processor 105 is capable of executing the program code accessed from memory 110 via interface circuitry 115.

Memory 110 includes one or more physical memory devices such as, for example, a local memory and a bulk storage device. Local memory refers to non-persistent memory device(s) generally used during actual execution of program code. Examples of local memory include random access memory (RAM) and/or any of the various types of RAM that are suitable for use by a processor during execution of program code (e.g., dynamic RAM or "DRAM" or static RAM or "SRAM"). A bulk storage device refers to a persistent data storage device. Examples of bulk storage devices include, but are not limited to, a hard disk drive (HDD), a solid-state drive (SSD), flash memory, a read-only memory (ROM), an erasable programmable read-only memory (EPROM), electrically erasable programmable read-only memory (EEPROM), or other suitable memory. In particular embodiments, system 100 includes one or more cache memories (not shown) that provide temporary storage of at least some program code to reduce the number of times program code must be retrieved from a bulk storage device during execution.

Examples of interface circuitry 115 include, but are not limited to, a system bus and an input/output (I/O) bus. Interface circuitry 115 can be implemented using any of a variety of bus architectures. Examples of bus architectures include, but are not limited to, Enhanced Industry Standard Architecture (EISA) bus, Accelerated Graphics Port (AGP), Video Electronics Standards Association (VESA) local bus, Universal Serial Bus (USB), and Peripheral Component Interconnect Express (PCIe) bus.

System 100 further can include one or more I/O devices 120 coupled to interface circuitry 115. I/O devices 120 can be coupled to system 100, e.g., interface circuitry 115, either directly or through intervening I/O controllers. Examples of I/O devices 120 include, but are not limited to, a keyboard, a display device, a pointing device, one or more communication ports, and a network adapter. A network adapter refers to circuitry that enables system 100 to become coupled to other systems, computer systems, remote printers, and/or remote storage devices through intervening private or public networks. Modems, cable modems, Ethernet cards, and wireless transceivers are examples of different types of network adapters that can be used with system 100.

Memory 110 is capable of storing program code and/or other data structures. For example, memory 110 is capable of storing an operating system 125 and one or more applications 130. Applications 130 can include a modeling environment and/or an electronic design automation (EDA) application. Memory 110 further can store an IP library 135. IP library 135 includes one or more blocks. In the example of FIG. 1, one or more blocks of IP library 135 are configured for use in developing RF systems. One or more blocks of IP library 135, for example, are implemented as multi-channel blocks referred to herein as SSR blocks. Each of the SSR blocks can represent a particular circuit function or primitive.

The SSR blocks of IP library 135 can be used in the modeling environment provided by applications 130. Within that environment, the SSR blocks of IP library 135 can be arranged and connected to create a model 140 of an RF system. System 100 is capable of generating an electronic system, e.g., a circuit design 145, from model 140 using the modeling environment and/or the EDA application. Circuit design 145 can be specified in a hardware description language (HDL). Examples of HDLs include, but are not limited to, Verilog, VHDL, a netlist, and a description in register transfer level (RTL) format. In particular embodiments, the EDA application is further capable of performing operations of a design flow (e.g., synthesis, placement, routing, and/or bitstream generation) on circuit design 145 so that the result can be implemented within an IC. In particular embodiments, the result is implemented within programmable circuitry of an IC. The IC can have an architecture the same as or similar to the architecture described in connection with FIG. 12.

An example of a modeling environment is an application such as MATLAB when used in combination with SIMULINK available from The Mathworks, Inc. of Natick, Mass. MATLAB, in combination with SIMULINK, is capable of executing further applications as part of the modeling environment. For example, the modeling environment can execute an application such as System Generator for DSP available from Xilinx, Inc. of San Jose, Calif. System Generator for DSP is a model-based design tool that facilitates design and exploration of electronic systems and/or circuit designs within ICs, including programmable ICs. System 100, executing application(s) 130, implements a high-level system (HLS) system in which models of designs are created and simulated.

System 100, e.g., processor 105, is capable of executing operating system 125 and application(s) 130 to perform the operations described within this disclosure. As such, operating system 125 and application(s) 130 can be considered an integrated part of system 100. Further, it should be appreciated that any data used, generated, and/or operated upon by system 100 (e.g., processor 105) such as blocks from IP library 135, model 140, circuit design 145, and the like are functional data structures that impart functionality when employed as part of the system.

System 100 can include fewer components than shown or additional components not illustrated in FIG. 1 depending upon the particular type of device and/or system that is implemented. In addition, the particular operating system, application(s), and/or I/O devices included can vary based upon system type. Further, one or more of the illustrative components can be incorporated into, or otherwise form a portion of, another component. For example, a processor can include at least some memory. System 100 can be used to implement a single computer or a plurality of networked or interconnected computers each implemented using the architecture of FIG. 1 or an architecture similar thereto.

Figure 2:
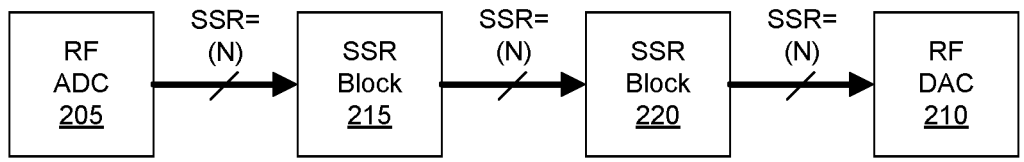
FIG. 2 illustrates a model of a radio frequency (RF) system in accordance with one or more embodiments described herein.

FIG. 2 illustrates an example of a model 200 of an RF system in accordance with one or more embodiments described herein. In the example of FIG. 2, model 200 is created within a modeling environment such as one provided by system 100. Model 200 can be displayed within a design window, e.g., a graphical user interface (GUI) generated and displayed by system 100.

Model 200 can be processed and ultimately implemented within an IC that includes programmable circuitry. The IC can also include an RF system. The RF system, for example, can include one or more antennas, an RF analog-to-digital converter (ADC) 205, and an RF digital-to-analog converter (DAC) 210. In particular embodiments, the IC includes hardwired circuit blocks for RF signal processing such as complex mixers, interpolation filters (e.g., digital up converters), decimation filters (e.g., digital down converters), and one or more other types of filters. In some cases, the output generated by RF ADC 205 can be directed into the hardwired circuit blocks for processing.

In other cases, users may wish to design their own RF processing circuitry. The hardwired circuit blocks, by their nature, impose limitations due to the fixed characteristics of the circuitry and static physical layout for routing signals between RF ADC 205, RF DAC 210, other hardwired circuit blocks, and/or the programable circuitry. Accordingly, the output from RF ADC 205 also can be directed into the programmable circuitry of the IC, thereby bypassing the hardwired circuit blocks and allowing users to create customized RF processing circuitry (e.g., customized complex mixers and filters). Similarly, output from the programmable circuitry can be directed to RF DAC 210.

In the example of FIG. 2, RF ADC 205 and RF DAC 210 are shown for purposes of illustration. RF ADC 205 and RF DAC 210 are not part of model 200. Within the design environment, RF ADC 205 and RF DAC 210, for example, can be represented within model 200 as a "source" of N-dimensional I/O data and as a "destination" of N-dimensional I/O data, respectively. In general, RF ADC 205 and RF DAC 210 are capable of operating at speeds of several Giga-samples per second. Because the programmable circuitry of the IC operates at slower speeds, RF ADC 205 is capable of outputting the serial RF I/O data as N-dimensional I/O data, e.g., in a vectorized or multi-channel output format, to SSR block 215.

The parameter specifying the number of dimensions output from RF ADC 205 and processed by SSR blocks 215 and 220 is the "super-sampling rate" or "SSR" parameter. The value of the SSR parameter can be a user-specified parameter or a system determined parameter for SSR blocks 215 and 220. For example, the value of the SSR parameter can be set to a value (e.g., 2, 3, 4, or more) that specifies the number of dimensions into which the serial RF I/O data is separated. Each dimension, as output from RF ADC 205, can be referred to as a data channel, e.g., a multi-bit data channel.

In the example of FIG. 2, a user is able to use the modeling environment to create a block-based model including one or more SSR blocks, e.g., SSR blocks 215 and 220. As illustrated in FIG. 2, despite their multi-channel nature, SSR blocks 215 and 220 can be connected using a single line that represents the number of data channels, e.g., N data channels as specified by the SSR parameter. As such, each line connecting RF ADC 205, SSR block 215, SSR block 220, and RF DAC 210 represents N different data channels.

Each data channel carries a stream of data. Each stream of data, however, may not be an independent channel of data. The sequential RF I/O data is exposed to the programmable circuitry of the IC (e.g., as represented by the model) as parallel data. If, for example, the serial RF I/O data is processed into vectorized data with N=4, each of data channels 1-4 would convey symbols 1-4, respectively, from the serial RF I/O data. The next symbols 5-8 of the serial RF I/O data would be conveyed on channels 1-4, respectively, and so on. It should be appreciated that in the case where a model includes a plurality of SSR blocks, the value of the SSR parameter is the same for each SSR block.

FIGS. 3-6, taken collectively, illustrate various aspects of creating a model using SSR blocks within a modeling environment and generating a circuit design. The model, once created, can be elaborated based upon parameters for the SSR blocks. The system, for example, is capable of automatically elaborating SSR blocks into functionally equivalent scalar instances of the blocks connected together in the modeling environment.

Figure 3:
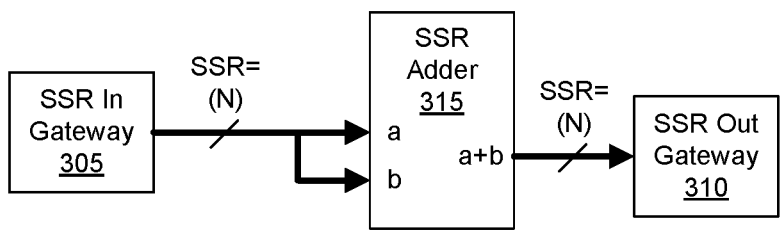
FIG. 3 illustrates another model of an RF system in accordance with one or more embodiments described herein.

FIG. 3 illustrates another example of a model 300 of an RF system in accordance with one or more embodiments described herein. In the example of FIG. 3, model 300 is created within a modeling environment such as one provided by system 100. Model 300 can be displayed within a design window, e.g., a GUI generated and displayed by system 100.

In the example of FIG. 3, model 300 includes a plurality of SSR bocks such as SSR in gateway block 305, SSR out gateway block 310, and SSR adder block 315. Each of the blocks is a multi-channel block. In general, SSR in gateway block 305 and SSR out gateway block 310 (collectively "SSR gateway blocks") are capable of performing data conversions between data types used within the modeling environment to data types used by the SSR blocks representing circuit functions. The SSR gateway blocks further define top-level input port(s) and output port(s), e.g., design interface-ports, in the circuit design that is later generated. Users can instantiate any number of SSR gateway blocks for a design based upon overall design requirements. The SSR gateway blocks further determine the naming for such ports in the top-level HDL entity. SSR gateway blocks are capable of providing other functions not described herein.

In general, SSR blocks other than SSR gateway blocks have one or more data in ports and one or more data out ports that are vector ports. The number of input ports and/or output ports of any given SSR block varies with the type and/or functionality of SSR block that is implemented. Further, the number of input ports and output ports of the SSR block are fixed. For example, SSR adder block 315 has two vector input ports (e.g., two primary input ports). Each of vector input ports a and b is connected to an output port of SSR in gateway block 305. SSR adder block 315 determines a vector sum of inputs a and b and outputs the vector sum from the output port (e.g., primary output port) of SSR adder block 315. The output port of SSR adder block 315 is connected to the input port of SSR out gateway block 310.

Figure 4:
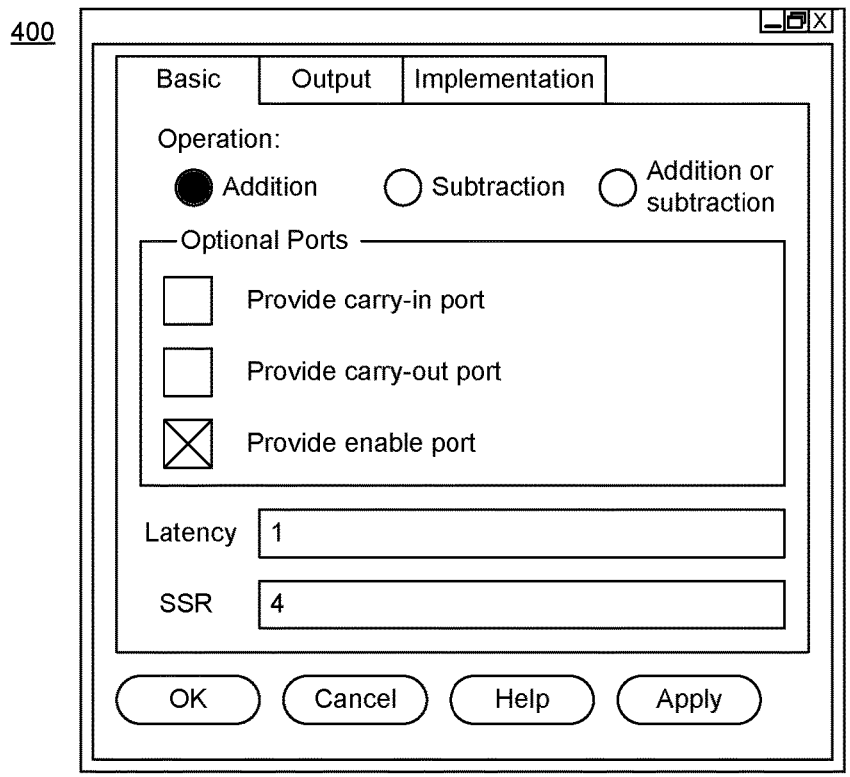
FIG. 4 is a graphical user interface configured to receive user-specified parameters for a super-sampling rate (SSR) block in accordance with one or more embodiments described herein.

FIG. 4 is an example GUI 400 configured to receive user-specified parameters for an SSR block in accordance with one or more embodiments described herein. For example, GUI 400 can be generated by the modeling environment and presented in response to a user request to specify parameters for SSR adder block 315 of FIG. 3. As such, parameters entered into GUI 400 can be saved to memory and used to elaborate SSR adder block 315. In the example of FIG. 4, a user can specify the operation to be performed by the SSR block. As shown, the particular SSR block corresponding to SSR adder block 315 can be configured to perform (vector) addition, (vector) subtraction, or both (vector) addition and subtraction. One or more optional ports for SSR adder block 315 can also be specified. A latency value can be specified and also a value for the SSR parameter.

In the example of FIG. 4, the various parameters shown can be specific to an SSR adder block. Other types of SSR blocks can have different types of optional ports available such as an output data valid port. Further, the types of operations available for selection can differ based upon the particular function or purpose of the SSR block. The SSR block, for example, can be capable of performing a variety of different types of operations or different variations of a given operation (e.g., different filters). Further, though not illustrated, it should be appreciated that different parameters, e.g., other than SSR and optional ports, can be specified through GUI 400 depending upon the particular functionality of the SSR block being parameterized.

Figure 5:
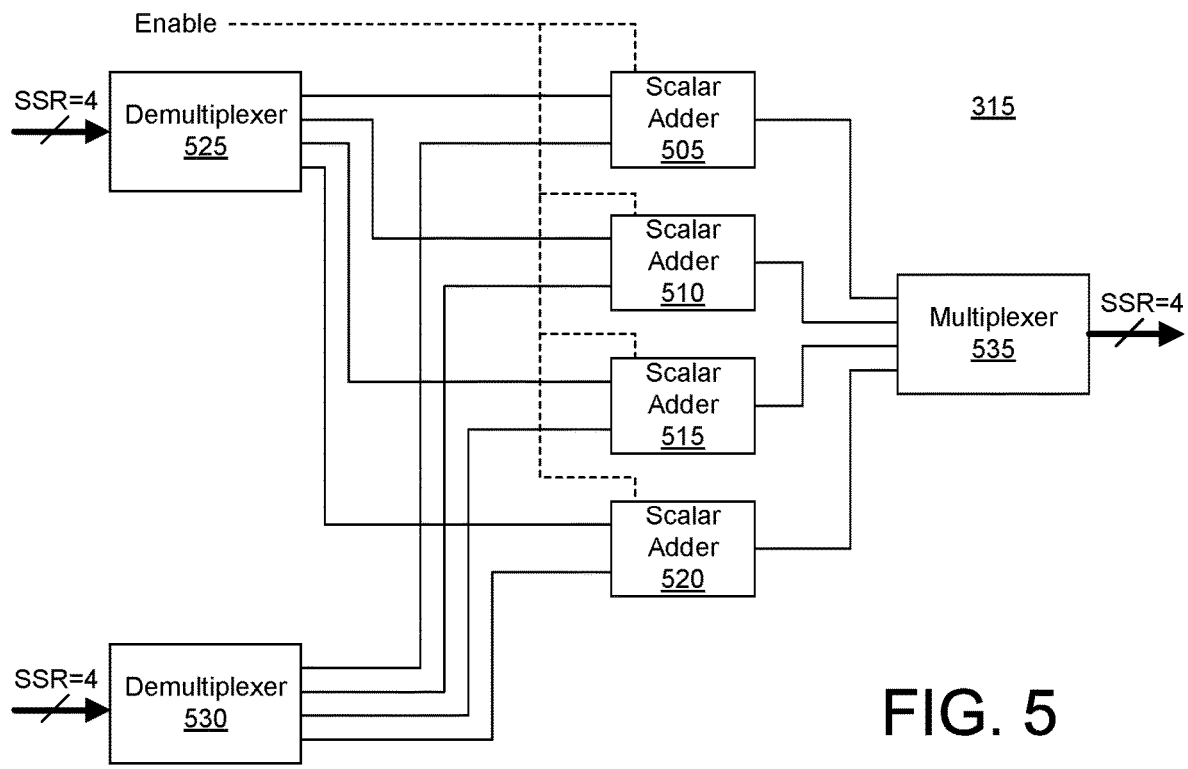
FIG. 5 illustrates an elaborated SSR block in accordance with one or more embodiments described herein.

FIG. 5 illustrates an elaborated example of an SSR block in accordance with one or more embodiments described herein. More particularly, FIG. 5 illustrates an elaborated example of SSR adder block 315 with an SSR value of 4 as specified in GUI 400 of FIG. 4. FIG. 5 illustrates automated processing performed by the system. Having created a model such as model 300, the user can request elaboration by the system. In response to the request, the system is capable of performing a variety of operations automatically that effectively expand the SSR block into the model architecture illustrated in FIG. 5.

In the example of FIG. 5, SSR adder block 315 is elaborated within the modeling environment by creating a number of scalar instances of the SSR block corresponding to the value of the SSR parameter. In the example of FIG. 5, since the SSR parameter is set to 4 in GUI 400, the system automatically generates 4 instances of a scalar adder block shown as scalar adders 505, 510, 515, and 520. Each scalar instance is capable of processing scalar inputs, e.g., a scalar sample for input a and a scalar sample for input b, processing the scalar input(s) (e.g., summing), and outputting a scalar sample. The scalar instances of the SSR block are arranged in parallel.

In the example of FIG. 5, the system further inserts a demultiplexer block 525 for input port a of each scalar adder 505-520 and a demultiplexer block 530 for input port b of each scalar adders 505-520. The output port of SSR in gateway block 305 is connected to the input port of demultiplexer block 525 and the input port of demultiplexer block 530. The system connects the output ports of demultiplexer block 525 to respective input ports a of scalar adders 505-520. The system connects the output ports of demultiplexer block 530 to respective input ports b of scalar adders 505-520. Demultiplexer blocks 525 and 530 are capable of selecting the particular scalar elements from the received vector and providing the selected scalar elements to the respective input ports of scalar adders 505-520. Due to the vectorization of the serial RF I/O data, there can be multiple symbols in the same data channel that must be separated out to different scalar instances 505-520. Demultiplexer blocks 525 and 530 perform this function.

The system further inserts multiplexer block 535. The output port of each of scalar adders 505-520 is connected to an input port of multiplexer block 535. The output port of multiplexer block 535 is connected to an input port of SSR out gateway block 310. Once each of scalar adders 505-520 performs a vector add operation, e.g., independently of the other scalar adders, multiplexer block 535 combines the individual outputs to structure an output signal as a vector. As such, the output from SSR adder block 315, as seen by the user, appears as a single connection and represents a vector output.

In the example of FIG. 5, the system has created an enable signal since the optional ports option for enable ports was selected in GUI 400. In the example of FIG. 5, the enable signal (shown in dashed line) is connected to each of scalar adders 505-520 directly. The enable signal is not routed through demultiplexer blocks 525, 530.

FIG. 5 also illustrates that the system is capable of creating one demultiplexer block for each primary input port of an SSR block. Further, FIG. 5 illustrates that the system is capable of creating one multiplexer block for each primary output port of an SSR block.

Figure 6:
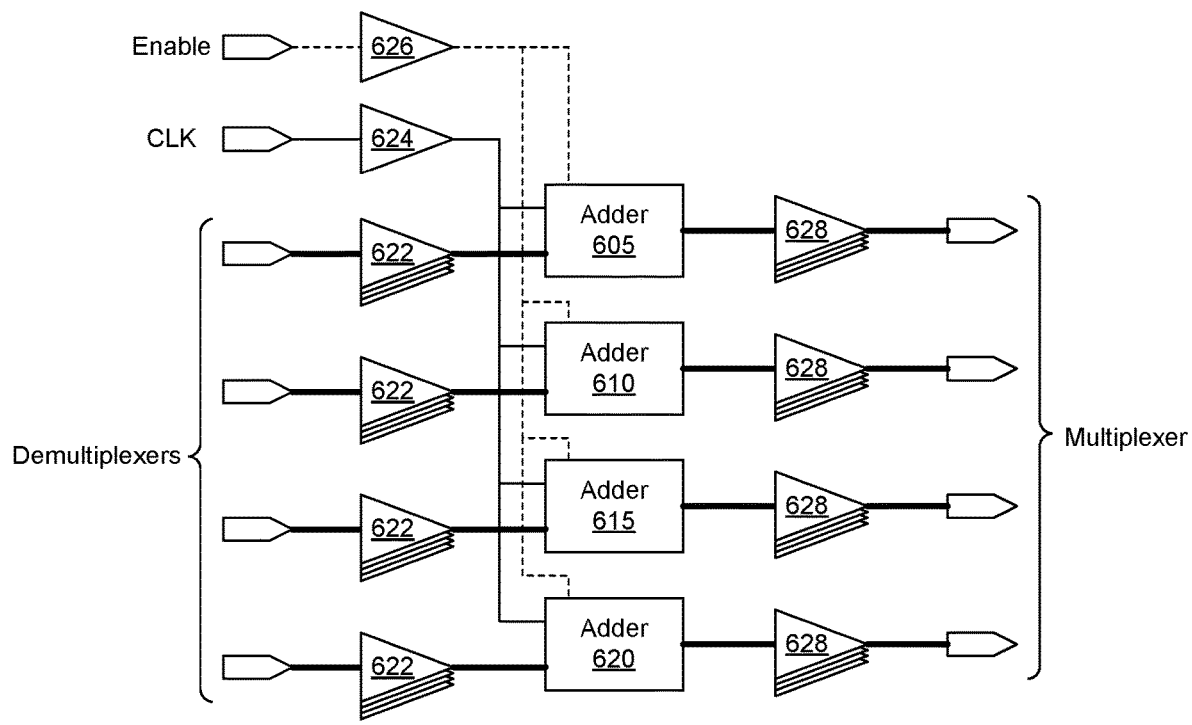
FIG. 6 illustrates a hardware description language (HDL) implementation of SSR adder in accordance with one or more embodiments described herein.

FIG. 6 illustrates an example HDL implementation of SSR adder block 315 in accordance with one or more embodiments described herein. In the example of FIG. 6, bolded lines represent multibit data signals. The multiplexers are not illustrated. A clock signal and an enable signal are shown. The scalar instances of the SSR block are implemented as adder modules 605, 610, 615, and 620. Each scalar instance is implemented as a separate module in parallel. In the example of FIG. 6, each of adder modules 605-620 receives a multibit data signal specifying both a and b, a clock (CLK) signal, and an enable signal.

The input data signals are buffered by input buffers 622. The output data signals are buffered by output buffers 628. The clock signal is buffered by buffer 624. The enable signal is buffered by buffer 626. Though FIG. 6 illustrates an HDL implementation, the resulting circuitry, as implemented in an IC, will also have the architecture illustrated in FIG. 6.

In one or more embodiments, the hardware that is implemented in the programmable circuitry of the IC is implemented such that scalar port connections are connected to scalar blocks. In this manner, the multiplexers and demultiplexers that exist in the elaborated model can be merged and/or dissolved within the hardware signal path formed of one or more SSR blocks. For example, the various multiplexers and demultiplexers shown in FIG. 8 may be merged and/or dissolved (e.g., removed) by establishing appropriate or correct scalar connections between the scalar blocks of the resulting data path.

Figure 7:
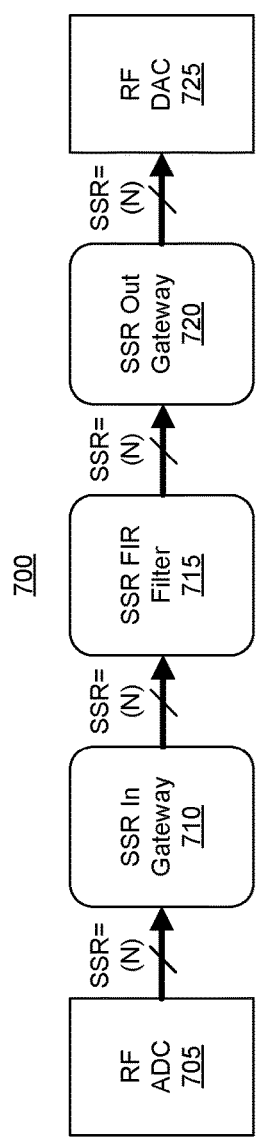
FIG. 7 illustrates a model of an RF system in accordance with one or more embodiments described herein.

FIG. 7 illustrates another example of a model 700 of an RF system in accordance with one or more embodiments described herein. In the example of FIG. 7, model 700 is created within a modeling environment such as one provided by system 100. Model 700 can be displayed within a design window, e.g., a GUI generated and displayed by system 100. In the example of FIG. 7, RF ADC 705 and RF ADC 725 are shown for purposes of illustration. Model 700 includes SSR blocks such as SSR in gateway block 710, an SSR finite impulse response (FIR) filter block 715, and SSR out gateway block 720.

Figure 8:
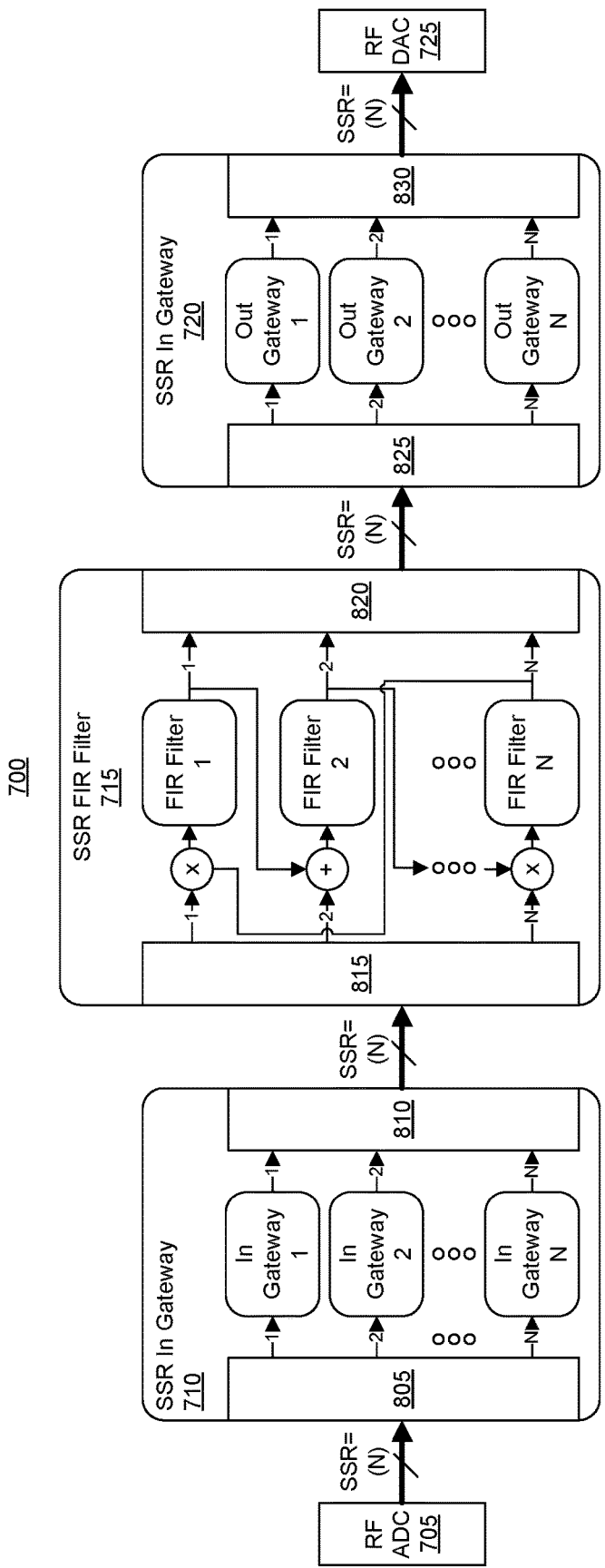
FIG. 8 illustrates a model in elaborated form in accordance with one or more embodiments described herein.

FIG. 8 illustrates an example of model 700 in elaborated form in accordance with one or more embodiments described herein. In the example of FIG. 8, each of the SSR blocks of model 700 in FIG. 7 is elaborated automatically by the system within the modeling environment. In the example of FIG. 8, the input design interface-port for the elaborated model 700 corresponds to the signal output from RF ADC 705 and received by demultiplexer 805. The output design interface-port corresponds to the signal output from multiplexer 830.

As illustrated, SSR in gateway block 710 is elaborated to include N scalar in gateway blocks 1-N (where SSR=N). The system further has inserted demultiplexer block 805 and multiplexer block 810. Each of the scalar in gateway blocks 1-N has an input port coupled to an output port of demultiplexer block 805. Demultiplexer block 805 receives a vector input and outputs the scalar signals 1-N to each scalar in gateway block. Each of the scalar in gateway blocks 1-N has an output port coupled to an input port of multiplexer block 810. Multiplexer block 810 generates a vector output that is provided to an input port of demultiplexer 815.

SSR FIR filter block 715 is elaborated to include N scalar FIR filter blocks 1-N. The system further has inserted demultiplexer block 815 and multiplexer block 820. Each of the scalar FIR filter blocks 1-N has an input port coupled to an output port of demultiplexer block 815. Demultiplexer block 815 receives a vector input and outputs the scalar signals 1-N to each scalar FIR filter block. Each of the scalar FIR filter blocks 1-N has an output port coupled to an input port of multiplexer block 820. Multiplexer block 820 generates a vector output that is provided to an input port of demultiplexer 825.

In one or more embodiments, certain SSR blocks are elaborated to include additional interconnections and/or function blocks that are capable of operating on different combinations of the scalar signals inside the SSR block. The additional interconnects and/or function blocks may operate on scalar inputs to the SSR block and/or scalar outputs generated by the scalar instances to provide the results to the inputs of the scalar instances of the SSR block. For SSR blocks that operate on a timeseries of data, e.g., an SSR FIR filter block or an SSR FFT filter block, the processing performed by the SSR block depends on the timeseries of input data. The input elements provided to the respective scalar instances of the filter must be arranged in a particular sequence for correct operation. As a result, the scalar instances of the filter do not operate on each channel independently. Instead, the scalar instances are interdependent. Depending upon the value of N and the filter implementation, the system automatically adds the necessary interconnects and/or function blocks between the scalar instances to establish the interdependence during elaboration. The added interconnects and/or function blocks further ensure that the input elements to each scalar instance are in the correct sequence based on the value of N, the filter type, and/or any other parameters of the SSR block.

Other SSR blocks such as SSR adder blocks, which operate element-wise, do not require the additional interconnections and/or function blocks as the scalar instances are capable of operating independently and in parallel.

SSR out gateway block 720 is elaborated to include N scalar out gateway blocks 1-N. The system further has inserted demultiplexer block 825 and multiplexer block 830. Each of the scalar out gateway blocks 1-N has an input port coupled to an output port of demultiplexer 825. Demultiplexer block 825 receives a vector input and outputs the scalar signals 1-N to each scalar out gateway block. Each of the scalar out gateway blocks 1-N has an output port coupled to an input port of multiplexer 830. Multiplexer block 830 generates a vector output that is provided to an input port of RF DAC 725 or other data destination within model 700.

Figure 9:
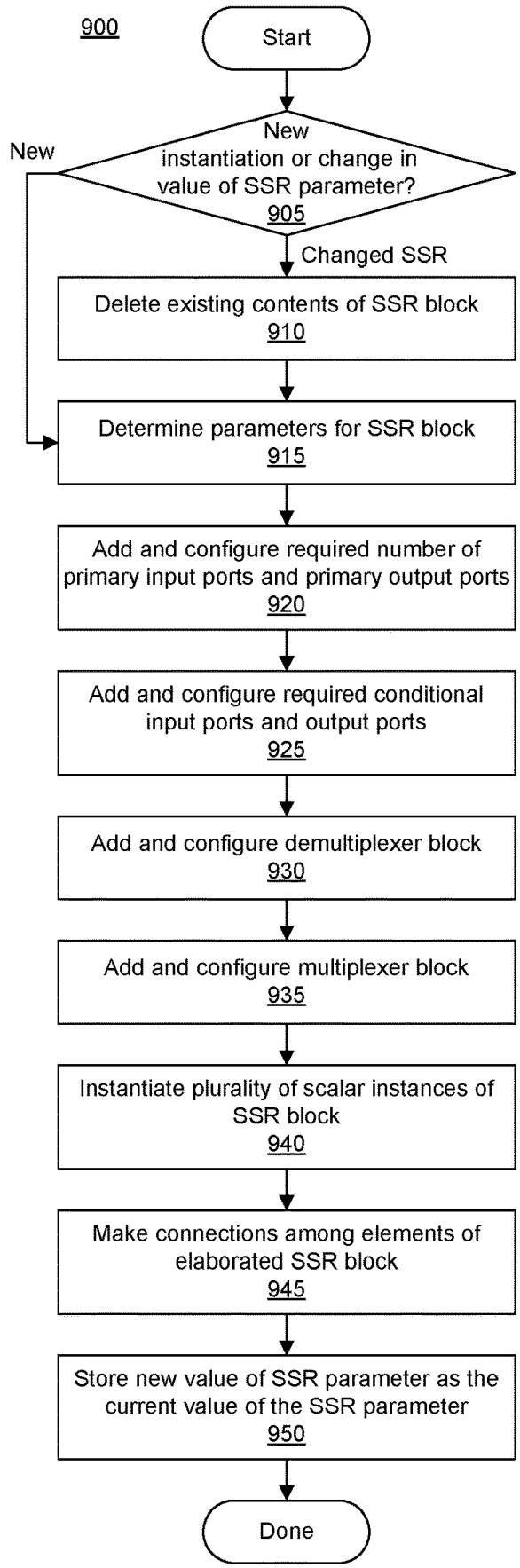
FIG. 9 illustrates a method of automatically elaborating a model in accordance with one or more embodiments described herein.

FIG. 9 illustrates an example method 900 of automatically elaborating a model in accordance with one or more embodiments described herein. Method 900 can be performed by a system such as system 100 described in connection with FIG. 1 or another system similar thereto. Method 900 begins in a state where at least one SSR block has been included in a model. Method 900 illustrates a process whereby the system automatically elaborates the SSR block(s) of the model based on parameters specified for the SSR block(s). For purposes of illustration, method 900 is described as if the model includes one SSR block. It should be appreciated, however, that the operations described in connection with method 900 can be performed for models that include a plurality of different SSR blocks.

In block 905, the system determines whether the SSR block is a new instantiation of an SSR block or is an existing SSR block having a changed value for the SSR parameter. In response to determining that the SSR block is a new instantiation, method 900 proceeds to block 915. In response to determining that the SSR block is an existing instantiation having a changed value for the SSR parameter, method 900 continues to block 910.

In block 910, the system deletes the existing contents of the SSR block. When the value of the SSR parameter for an SSR block is changed, the system clears the entire subsystem built for the SSR block and must rebuild the subsystem. For example, the system is capable of deleting existing ports of the SSR block, multiplexer(s) and demultiplexer(s), connections within the SSR block, and/or scaler instances existing within the SSR block.

In block 915, the system determines the parameters specified for the SSR block. For example, the system determines a value for each of the parameters available for the SSR block as can be specified via a GUI as described herein or through some other mechanism such as a configuration file or the like.

In block 920, the system adds and configures the required number of primary input port(s) and the required number of primary output port(s) for the SSR block. As noted, the number of primary input ports and the number of primary output ports for an SSR block depends upon the functionality and/or type of the SSR block. In this regard, the number of primary input ports and the number of primary output ports are fixed. For example, the system adds two primary input ports and one primary output port for an SSR adder block. In another example, the system adds one primary input port and one primary output port for an SSR filter block. The system configures each of the ports with the correct bit width. For example, the system determines the vector size from the value of N and sets the vector size of each primary input port and each primary output port of the SSR block to N.

In block 925, the system adds and configures the required conditional input ports and output ports for the SSR block based on the specified parameters. For example, if the parameters for the SSR block indicate that the SSR block has an input enable and/or an output enable, the system adds the input enable and the output enable ports to the SSR block.

In block 930, the system adds and configures a demultiplexer block for the SSR block. The system configures the demultiplexer block to provide the correct samples via each of the data channels that will connect to scaler instances of the SSR block. The system includes the demultiplexer block configured to receive the N-dimensional data and output N scalar signals. Further, the system is capable of including a number of demultiplexer blocks that is equivalent to the number of primary input ports of the SSR block. For example, in the case of an SSR adder block with two primary input ports, the system includes two demultiplexer blocks as previously described herein. In the case of a filter, the system includes a single demultiplexer block.

In block 935, the system adds and configures a multiplexer block for the SSR block. The multiplexer block is configured to generate vector output data from the output of each of the plurality of scalar instances of the SSR block. In block 940, the system instantiates a plurality of scaler instances of the SSR block. As part of instantiating the scaler instances of the SSR block, the system further can parameterize each of the scaler instances of the SSR block using the parameters for the SSR block. As an illustrative and nonlimiting example, if the operation type specified for the SSR block is "addition," the system parameterizes or configures (e.g., writes parameters for) each of the scaler blocks as a scalar addition block. In another example, if one or more parameters for a particular filter type of the SSR block are provided, those parameters can be used to parameterize each of the scaler filter blocks.

In block 945, the system makes connections among the various elements of the elaborated SSR block. For example, the system connects each output port of the demultiplexer of the SSR block to an input port of a corresponding scalar instance of the SSR block. The system connects each output port of a scalar instance of the SSR block to a corresponding input port of the multiplexer. The system is further capable of connecting the input design interface-port to the input ports of the demultiplexer of the SSR block. The system is capable of connecting the output design interface-port to the output of the multiplexer.

It should be appreciated that in the case where there are multiple SSR blocks as is illustrated in FIG. 8, the input ports of the demultiplexer block of the first SSR block are connected to the input design interface-port, while the output port of the multiplexer block 830 of the last SSR block is connected to the output design interface-port. In addition, the output port of the multiplexer block of each SSR block followed by another SSR block is connected to the input port of the demultiplexer block in the following SSR block. Further, the system is capable of connecting internal elements within each respective SSR block as previously described.

In block 950, the system stores the new value of the SSR parameter as the current value of the SSR parameter in memory.

Figure 10:
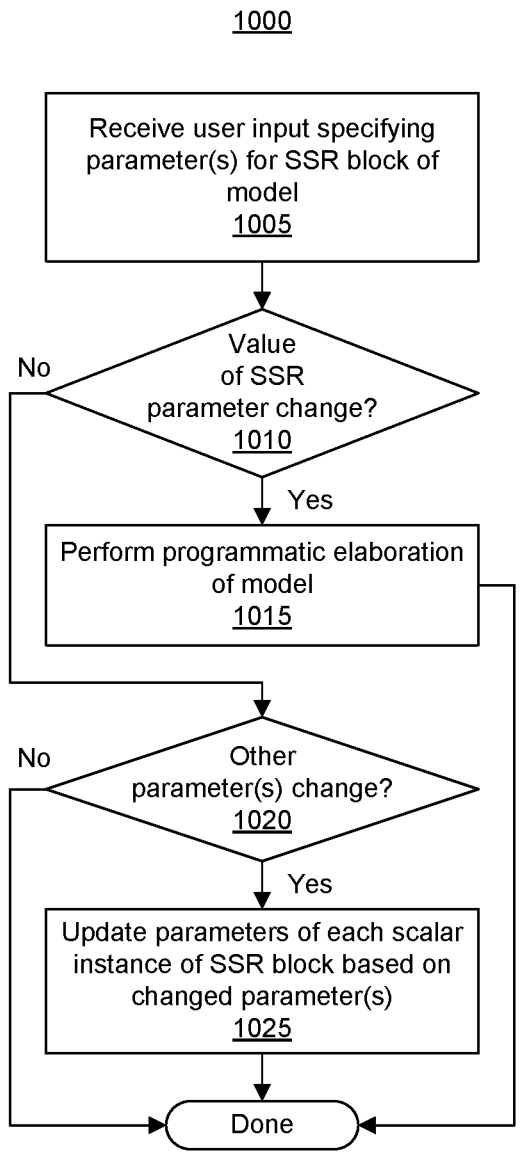
FIG. 10 illustrates a method of implementing a circuit design from a model in accordance with one or more embodiments described herein.

FIG. 10 illustrates an example method 1000 of implementing a circuit design from a model in accordance with one or more embodiments described herein. Method 1000 can be performed by a system such as system 100 described in connection with FIG. 1 or another system similar thereto. Method 1000 begins in a state where at least one SSR block has been included in a model. Method 1000 illustrates a process whereby parameters can be defined for the SSR block and the SSR block elaborated by the system automatically based on the specified parameter(s). In the example of FIG. 10, a process as described in connection with FIG. 9 has been performed so that an initial elaboration of the SSR block of the model has been created.

In block 1005, the system receives user input specifying one or more parameters for the SSR block. For example, user can issue a request to the system to specify one or more parameters for the SSR block of the model. In response to the request, the system can present the user with a GUI such as the GUI described in connection with FIG. 4. The system receives one or more parameters for the SSR block that the user enters through the GUI. The parameters can include, but are not limited to, a type of operation to be performed by the SSR block, optional ports to be included within the SSR block, a latency value for the SSR block, and/or an SSR value for the SSR block.

In block 1010, the system determines whether the value of the SSR parameter has changed. For example, the system is capable of comparing a newly specified value of the SSR parameter (e.g., as received in block 1005) with a current (e.g., previous) value of the SSR parameter stored in memory for the SSR block. In response to determining that the value of the SSR parameter has changed, e.g., that the new value of the SSR parameter is different from the prior or existing value of the SSR parameter, method 1000 continues to block 1015. In response to determining that the value of the SSR parameter has not changed, e.g., that the new value of the SSR parameter is the same as the prior or existing value of the SSR parameter, method 1000 continues to block 1020.

In block 1015, the system automatically performs programmatic elaboration of the model including the SSR block. For example, the system can perform a process as described in connection with FIG. 9 to implement block 1015. After performing programmatic elaboration in block 1015, method 1000 can end.

In block 1020, the system determines whether one or more other parameters of the SSR block have changed. The system is capable of comparing each of the new values of parameters specified for the SSR block with prior or existing values for the corresponding parameters for the SSR block to determine which, if any of the values of parameters have changed. In response to determining that one or more parameters have changed, method 1000 continues to block 1025. In response to determining that none of the parameters have changed, method 1000 can end.

In block 1025, the system is capable of updating the parameter values for each of the scaler instances of the SSR block. For example, the system is capable of writing any newly specified values of parameters for the SSR block to the corresponding parameters of each scalar instance of the SSR block. As an illustrative and nonlimiting example, if the value of the latency parameter of the SSR block has changed, the system updates the value of the latency parameter of each scalar instance of the SSR block to match the changed value of the latency parameter of the SSR block. The system can perform similar operations by adding and/or removing conditional signals for the scalar instances of the SSR block based on which of such parameters have changed for the SSR block.

In one or more other embodiments, the system is capable of automatically determining the value of the SSR parameter for a model being implemented in the modeling environment. For example, the model being created can have a specification associated therewith (e.g., stored in the system) that specifies one or more requirements for the system. The specification, for example, can specify the frequency at which the circuit design is to operate within the target IC. In another example, a designer can provide the frequency at which the circuit design is to operate within the IC as a user input to the system. In one or more embodiments, the system is capable of determining an initial value for the SSR parameter by dividing the frequency of the incoming serial RF data by the target frequency of the circuit design. The system can also predict the value of the SSR parameter by performing multiple iterations.

For example, the value of N is generally constrained by the target frequency (e.g., timing closure) of the design and resource availability in the target programmable IC. In cases where the target programmable IC has more resources available for a given N and corresponding implementation, the system is capable of increasing the value of N. In cases where the target programmable IC does not have sufficient resources available for a given N and corresponding implementation, the system is capable of decreasing the value of N. The system is capable of automatically synthesizing the elaborated model and generating a table of different values of N. The table further can specify the resource requirements and target frequency achievable (e.g., timing closure) for each value of N. In particular embodiments, the system is capable of performing the synthesis described as a background process so that results may be available throughout the time that the user creates and/or edits the model of the RF system. In particular embodiments, the system is capable of iteratively tuning the value of N until timing closure is achieved.

Figure 11:
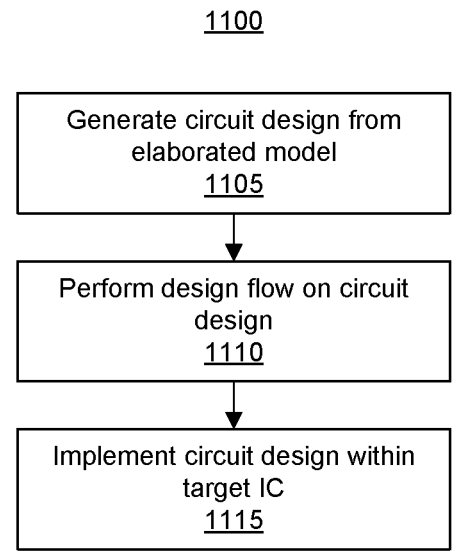
FIG. 11 illustrates a method of implementing a circuit design within an integrated circuit (IC) in accordance with one or more embodiments described herein.

FIG. 11 illustrates an example method 1100 of implementing a circuit design within an IC in accordance with one or more embodiments described herein. Method 1100 can be performed by a system such as system 100 described in connection with FIG. 1 or another system similar thereto. Method 1100 begins in a state where a model has been elaborated.

In block 1105, the system is capable of generating a circuit design from the elaborated model. In block 1110, the system is capable of performing a design flow on the circuit design. For example, the system is capable of performing synthesis, placement, routing, and/or bitstream generation on the circuit design. In one or more embodiments, elaborated blocks of the model correspond to portions of HDL that may be stitched together during synthesis. In one or more other embodiments, elaborated blocks of the model may correspond to high-level programming language code such as C and/or C++ that may be transformed into HDL.

In block 1115, the system is capable of implementing the circuit design, as processed through the design flow, within a target IC. For example, the system or another system is capable of loading a configuration bitstream specifying the circuit design within the target IC, which physically implements the circuit design within the target IC. As discussed, the target IC can be a programmable IC in which case the configuration bitstream configures programmable circuitry within the target IC to implement the circuit design (and the model).

ICs can be implemented to perform a variety of functions. Some ICs can be programmed to perform specified functions. One example of an IC that can be programmed is a field programmable gate array (FPGA). An FPGA includes programmable circuitry implemented as an array of programmable tiles. Each programmable tile typically includes both programmable interconnect circuitry and programmable logic circuitry. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect circuitry and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect and programmable logic circuitries are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to, these devices and further can encompass devices that are only partially programmable. For example, one type of programmable IC includes a combination of hard-coded transistor logic and a programmable switch fabric that programmably interconnects the hard-coded transistor logic.

Figure 12:
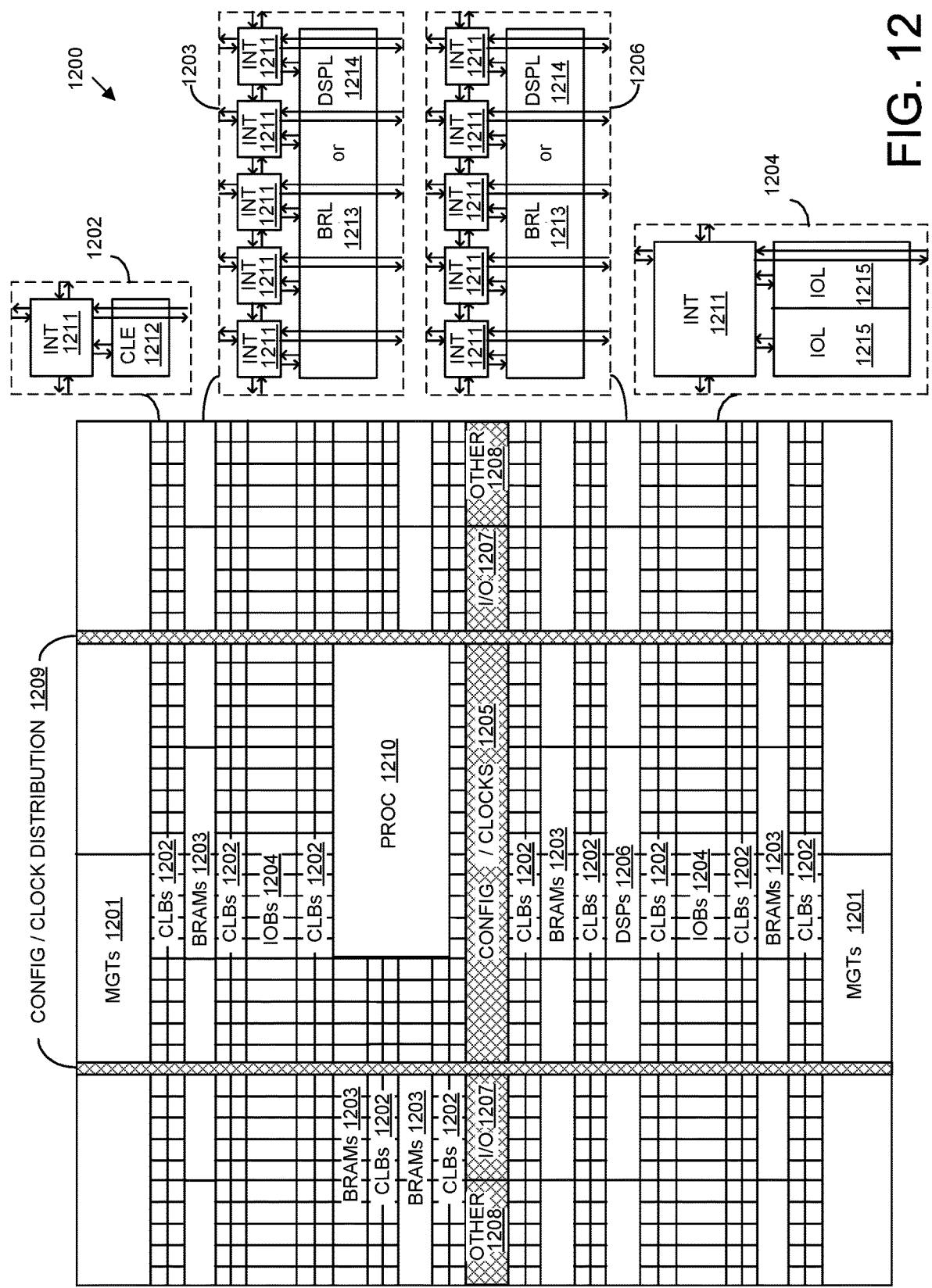
FIG. 12 illustrates an architecture for an IC in accordance with one or more embodiments described herein.

FIG. 12 illustrates an example architecture 1200 for an IC. In one aspect, architecture 1200 can be implemented within a programmable IC. For example, architecture 1200 can be used to implement a field programmable gate array (FPGA). Architecture 1200 can also be representative of a system-on-chip (SoC) type of IC. An SoC is an IC that includes a processor that executes program code and one or more other circuits. The other circuits can be implemented as hardwired circuitry, programmable circuitry, and/or a combination thereof. The circuits can operate cooperatively with one another and/or with the processor.

As shown, architecture 1200 includes several different types of programmable circuit, e.g., logic, blocks. For example, architecture 1200 can include a large number of different programmable tiles including multi-gigabit transceivers (MGTs) 1201, configurable logic blocks (CLBs) 1202, random access memory blocks (BRAMs) 1203, input/output blocks (IOBs) 1204, configuration and clocking logic (CONFIG/CLOCKS) 1205, digital signal processing blocks (DSPs) 1206, specialized I/O blocks 1207 (e.g., configuration ports and clock ports), and other programmable logic 1208 such as digital clock managers, ADC(s), DAC(s), RF subsystems with RF ADC(s) and/or RF DAC(s), system monitoring logic, and so forth. The RF subsystem can be a hardwired circuit block or blocks.

In some ICs, each programmable tile includes a programmable interconnect element (INT) 1211 having standardized connections to and from a corresponding INT 1211 in each adjacent tile. Therefore, INTs 1211, taken together, implement the programmable interconnect structure for the illustrated IC. Each INT 1211 also includes the connections to and from the programmable logic element within the same tile, as shown by the examples included at the top of FIG. 12.

For example, a CLB 1202 can include a configurable logic element (CLE) 1212 that can be programmed to implement user logic plus a single INT 1211. A BRAM 1203 can include a BRAM logic element (BRL) 1213 in addition to one or more INTs 1211. Typically, the number of INTs 1211 included in a tile depends on the height of the tile. As pictured, a BRAM tile has the same height as five CLBs, but other numbers (e.g., four) also can be used. A DSP tile 1206 can include a DSP logic element (DSPL) 1214 in addition to an appropriate number of INTs 1211. An IOB 1204 can include, for example, two instances of an I/O logic element (IOL) 1215 in addition to one instance of an INT 1211. The actual I/O pads connected to IOL 1215 may not be confined to the area of IOL 1215.

In the example pictured in FIG. 12, a columnar area near the center of the die, e.g., formed of regions 1205, 1207, and 1208, can be used for configuration, clock, and other control logic. Horizontal areas 1209 extending from this column can be used to distribute the clocks and configuration signals across the breadth of the programmable IC.

Some ICs utilizing the architecture illustrated in FIG. 12 include additional logic blocks that disrupt the regular columnar structure making up a large part of the IC. The additional logic blocks can be programmable blocks and/or dedicated circuitry. For example, a processor block depicted as PROC 1210 spans several columns of CLBs and BRAMs.

In one aspect, PROC 1210 can be implemented as dedicated circuitry, e.g., as a hardwired processor, that is fabricated as part of the die that implements the programmable circuitry of the IC. PROC 1210 can represent any of a variety of different processor types and/or systems ranging in complexity from an individual processor, e.g., a single core capable of executing program code, to an entire processor system having one or more cores, modules, co-processors, interfaces, or the like.

In another aspect, PROC 1210 can be omitted from architecture 1200 and replaced with one or more of the other varieties of the programmable blocks described. Further, such blocks can be utilized to form a "soft processor" in that the various blocks of programmable circuitry can be used to form a processor that can execute program code as is the case with PROC 1210.

The phrase "programmable circuitry" refers to programmable circuit elements within an IC, e.g., the various programmable or configurable circuit blocks or tiles described herein, as well as the interconnect circuitry that selectively couples the various circuit blocks, tiles, and/or elements according to configuration data that is loaded into the IC. For example, circuit blocks shown in FIG. 12 that are external to PROC 1210 such as CLBs 1202 and BRAMs 1203 are considered programmable circuitry of the IC.

In general, the functionality of programmable circuitry is not established until configuration data is loaded into the IC. A set of configuration bits can be used to program programmable circuitry of an IC such as an FPGA. The configuration bit(s) typically are referred to as a "configuration bitstream."

In general, programmable circuitry is not operational or functional without first loading a configuration bitstream into the IC. The configuration bitstream effectively implements a particular circuit design within the programmable circuitry. The circuit design specifies, for example, functional aspects of the programmable circuit blocks and physical connectivity among the various programmable circuit blocks.

Circuitry that is "hardwired" or "hardened," i.e., not programmable, is manufactured as part of the IC. Unlike programmable circuitry, hardwired circuitry or circuit blocks are not implemented after the manufacture of the IC through the loading of a configuration bitstream. Hardwired circuitry is generally considered to have dedicated circuit blocks and interconnects, for example, that are functional without first loading a configuration bitstream into the IC, e.g., PROC 1210.

In some instances, hardwired circuitry can have one or more operational modes that can be set or selected according to register settings or values stored in one or more memory elements within the IC. The operational modes can be set, for example, through the loading of a configuration bitstream into the IC. Despite this ability, hardwired circuitry is not considered programmable circuitry as the hardwired circuitry is operable and has a particular function when manufactured as part of the IC.

In the case of an SoC, the configuration bitstream can specify the circuitry that is to be implemented within the programmable circuitry and the program code that is to be executed by PROC 1210 or a soft processor. In some cases, architecture 1200 includes a dedicated configuration processor that loads the configuration bitstream to the appropriate configuration memory and/or processor memory. The dedicated configuration processor does not execute user-specified program code. In other cases, architecture 1200 can utilize PROC 1210 to receive the configuration bitstream, load the configuration bitstream into appropriate configuration memory, and/or extract program code for execution.

FIG. 12 is intended to illustrate an example architecture that can be used to implement an IC that includes programmable circuitry, e.g., a programmable fabric. For example, the number of logic blocks in a column, the relative width of the columns, the number and order of columns, the types of logic blocks included in the columns, the relative sizes of the logic blocks, and the interconnect/logic implementations included at the top of FIG. 12 are purely illustrative. In an actual IC, for example, more than one adjacent column of CLBs is typically included wherever the CLBs appear, to facilitate the efficient implementation of a user circuit design. The number of adjacent CLB columns, however, can vary with the overall size of the IC. Further, the size and/or positioning of blocks such as PROC 1210 within the IC are for purposes of illustration only and are not intended as limitations.

For purposes of explanation, specific nomenclature is set forth to provide a thorough understanding of the various inventive concepts disclosed herein. The terminology used herein, however, is for the purpose of describing particular aspects of the inventive arrangements only and is not intended to be limiting.

As defined herein, the singular forms "a," "an," and "the" are intended to include the plural forms as well, unless the context clearly indicates otherwise.

As defined herein, the term "approximately" means nearly correct or exact, close in value or amount but not precise. For example, the term "approximately" can mean that the recited characteristic, parameter, or value is within a predetermined amount of the exact characteristic, parameter, or value.

As defined herein, the terms "at least one," "one or more," and "and/or," are open-ended expressions that are both conjunctive and disjunctive in operation unless explicitly stated otherwise. For example, each of the expressions "at least one of A, B, and C," "at least one of A, B, or C," "one or more of A, B, and C," "one or more of A, B, or C," and "A, B, and/or C" means A alone, B alone, C alone, A and B together, A and C together, B and C together, or A, B and C together.

As defined herein, the term "automatically" means without user intervention. As defined herein, the term "user" means a human being.

As defined herein, the term "computer readable storage medium" means a storage medium that contains or stores program code for use by or in connection with an instruction execution system, apparatus, or device. As defined herein, a "computer readable storage medium" is not a transitory, propagating signal per se. A computer readable storage medium can be, but is not limited to, an electronic storage device, a magnetic storage device, an optical storage device, an electromagnetic storage device, a semiconductor storage device, or any suitable combination of the foregoing. The various forms of memory, as described herein, are examples of computer readable storage media. A non-exhaustive list of more specific examples of a computer readable storage medium can include: a portable computer diskette, a hard disk, a RAM, a read-only memory (ROM), an erasable programmable read-only memory (EPROM or Flash memory), an electronically erasable programmable read-only memory (EEPROM), a static random access memory (SRAM), a portable compact disc read-only memory (CD-ROM), a digital versatile disk (DVD), a memory stick, a floppy disk, or the like.

As defined herein, the term "if" means "when" or "upon" or "in response to" or "responsive to," depending upon the context. Thus, the phrase "if it is determined" or "if [a stated condition or event] is detected" can be construed to mean "upon determining" or "in response to determining" or "upon detecting [the stated condition or event]" or "in response to detecting [the stated condition or event]" or "responsive to detecting [the stated condition or event]" depending on the context.

As defined herein, the term "responsive to" and similar language as described above, e.g., "if," "when," or "upon," means responding or reacting readily to an action or event. The response or reaction is performed automatically. Thus, if a second action is performed "responsive to" a first action, there is a causal relationship between an occurrence of the first action and an occurrence of the second action. The term "responsive to" indicates the causal relationship.

As defined herein, the terms "one embodiment," "an embodiment," "one or more embodiments," "particular embodiments," or similar language mean that a particular feature, structure, or characteristic described in connection with the embodiment is included in at least one embodiment described within this disclosure. Thus, appearances of the phrases "in one embodiment," "in an embodiment," "in one or more embodiments," "in particular embodiments," and similar language throughout this disclosure can, but do not necessarily, all refer to the same embodiment. The terms "embodiment" and "arrangement" are used interchangeably within this disclosure.

As defined herein, the term "processor" means at least one hardware circuit. The hardware circuit can be configured to carry out instructions contained in program code. The hardware circuit can be an integrated circuit. Examples of a processor include, but are not limited to, a central processing unit (CPU), an array processor, a vector processor, a digital signal processor (DSP), an FPGA, a programmable logic array (PLA), an ASIC, programmable logic circuitry, and a controller.

As defined herein, the term "substantially" means that the recited characteristic, parameter, or value need not be achieved exactly, but that deviations or variations, including for example, tolerances, measurement error, measurement accuracy limitations, and other factors known to those of skill in the art, can occur in amounts that do not preclude the effect the characteristic was intended to provide.

The terms first, second, etc. are used herein to describe various elements. These elements should not be limited by these terms, as these terms are only used to distinguish one element from another unless stated otherwise or the context clearly indicates otherwise.

A computer program product can include a computer readable storage medium (or media) having computer readable program instructions thereon for causing a processor to carry out aspects of the inventive arrangements described herein. Within this disclosure, the term "program code" is used interchangeably with the term "computer readable program instructions." Computer readable program instructions described herein can be downloaded to respective computing/processing devices from a computer readable storage medium or to an external computer or external storage device via a network, for example, the Internet, a LAN, a WAN and/or a wireless network. The network can include copper transmission cables, optical transmission fibers, wireless transmission, routers, firewalls, switches, gateway computers and/or edge devices including edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations for the inventive arrangements described herein can be assembler instructions, instruction-set-architecture (ISA) instructions, machine instructions, machine dependent instructions, microcode, firmware instructions, or either source code or object code written in any combination of one or more programming languages, including an object oriented programming language and/or procedural programming languages. Computer readable program instructions can include state-setting data. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a LAN or a WAN, or the connection can be made to an external computer (for example, through the Internet using an Internet Service Provider). In some cases, electronic circuitry including, for example, programmable logic circuitry, an FPGA, or a PLA can execute the computer readable program instructions by utilizing state information of the computer readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer readable program instructions, e.g., program code.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the operations specified in the flowchart and/or block diagram block or blocks.

The computer readable program instructions can also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams can represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The corresponding structures, materials, acts, and equivalents of all means or step plus function elements that may be found in the claims below are intended to include any structure, material, or act for performing the function in combination with other claimed elements as specifically claimed.

In one or more embodiments, a method can include determining, using computer hardware, a value of a parameter of a super-sampling rate (SSR) block within a model of a circuit, wherein the value indicates a number of a plurality of data channels of the SSR block, automatically creating, using the computer hardware, a primary input port and a primary output port for the SSR block based on functionality of the SSR block, wherein vector size of the primary input port and the primary output port is determined from the value of the parameter, automatically creating, using the computer hardware, a plurality of scalar instances of the SSR block based on the value of the parameter, wherein the plurality of scalar instances are arranged in parallel, and configuring, using the computer hardware, each scalar instance of the plurality of scalar instances based on a parameterization of the SSR block.

In one aspect, the SSR block is implemented as a sub-system that contains the plurality of scalar instances.

In another aspect, the method includes creating a de-multiplexer block for each primary input port, wherein the de-multiplexer block is configured to convey selected samples from vector input data to different ones of the plurality of scalar instances of the SSR block.

In another aspect, the method includes creating a multiplexer block for each primary output port, wherein the multiplexer block is configured to create vector output data from samples output from each of the plurality of scalar instances of the SSR block.

In another aspect, the method includes connecting the de-multiplexer block, the multiplexer block, and the plurality of scalar instances of the SSR block together.

In another aspect, the method includes adding a conditional input port to each of the plurality of scalar instances based on the parameterization of the SSR block.

In another aspect, the method includes adding a conditional output port to each of the plurality of scalar instances based on the parameterization of the SSR block.

In another aspect, the method includes determining the value of the parameter of the SSR block automatically based on a data rate of an RF signal to be processed by the model and a clock rate of programmable circuitry of an integrated circuit used to implement the model.

In another aspect, the method includes iteratively tuning the value of the parameter until timing closure is achieved.

In another aspect, the method includes generating a circuit design from the model.

In one or more embodiments, a system includes a processor. The processor, in response to executing program code, is configured to initiate operations including determining a value of a parameter of an SSR block within a model of a circuit, wherein the value indicates a number of a plurality of data channels of the SSR block, automatically creating a primary input port and a primary output port for the SSR block based on functionality of the SSR block, wherein vector size of the primary input port and the primary output port is determined from the value of the parameter, automatically creating a plurality of scalar instances of the SSR block based on the value of the parameter, wherein the plurality of scalar instances are arranged in parallel, and configuring each scalar instance of the plurality of scalar instances based on a parameterization of the SSR block.

In one aspect, the SSR block is implemented as a sub-system that contains the plurality of scalar instances.

In another aspect, the processor is configured to initiate operations including creating a de-multiplexer block for each primary input port, wherein the de-multiplexer block is configured to convey selected samples from vector input data to different ones of the plurality of scalar instances of the SSR block.

In another aspect, the processor is configured to initiate operations including creating a multiplexer block for each primary output port, wherein the multiplexer block is configured to create vector output data from samples output from each of the plurality of scalar instances of the SSR block.

In another aspect, the processor is configured to initiate operations including connecting the de-multiplexer block, the multiplexer block, and the plurality of scalar instances of the SSR block together.

In another aspect, the processor is configured to initiate operations including adding a conditional input port to each of the plurality of scalar instances based on the parameterization of the SSR block.

In another aspect, the processor is configured to initiate operations including adding a conditional output port to each of the plurality of scalar instances based on the parameterization of the SSR block.

In another aspect, the processor is configured to initiate operations including determining the value of the parameter of the SSR block automatically based on a data rate of an RF signal to be processed by the model and a clock rate of programmable circuitry of an integrated circuit used to implement the model.

In another aspect, the processor is configured to initiate operations including iteratively tuning the value of the parameter until timing closure is achieved.

In another aspect, the processor is configured to initiate operations including generating a circuit design from the model.

In one or more embodiments, a computer program product includes a computer readable storage medium having program code stored thereon. The program code is executable by a processor to perform operations. The operations can include determining a value of a parameter of an SSR block within a model of a circuit, wherein the value indicates a number of a plurality of data channels of the SSR block, automatically creating a primary input port and a primary output port for the SSR block based on functionality of the SSR block, wherein vector size of the primary input port and the primary output port is determined from the value of the parameter, automatically creating a plurality of scalar instances of the SSR block based on the value of the parameter, wherein the plurality of scalar instances are arranged in parallel, and configuring each scalar instance of the plurality of scalar instances based on a parameterization of the SSR block.

In another aspect, the SSR block is implemented as a subsystem that contains the plurality of scalar instances.

In another aspect, the operations include creating a de-multiplexer block for each primary input port, wherein the de-multiplexer block is configured to convey selected samples from vector input data to different ones of the plurality of scalar instances of the SSR block.

In another aspect, the operations include creating a multiplexer block for each primary output port, wherein the multiplexer block is configured to create vector output data from samples output from each of the plurality of scalar instances of the SSR block.

In another aspect, the operations include connecting the de-multiplexer block, the multiplexer block, and the plurality of scalar instances of the SSR block together.

In another aspect, the operations include adding a conditional input port to each of the plurality of scalar instances based on the parameterization of the SSR block.

In another aspect, the operations include adding a conditional output port to each of the plurality of scalar instances based on the parameterization of the SSR block.

In another aspect, the operations include determining the value of the parameter of the SSR block automatically based on a data rate of an RF signal to be processed by the model and a clock rate of programmable circuitry of an integrated circuit used to implement the model.

In another aspect, the operations include iteratively tuning the value of the parameter until timing closure is achieved.

In another aspect, the operations include generating a circuit design from the model.

The description of the inventive arrangements provided herein is for purposes of illustration and is not intended to be exhaustive or limited to the form and examples disclosed. The terminology used herein was chosen to explain the principles of the inventive arrangements, the practical application or technical improvement over technologies found in the marketplace, and/or to enable others of ordinary skill in the art to understand the inventive arrangements disclosed herein. Modifications and variations may be apparent to those of ordinary skill in the art without departing from the scope and spirit of the described inventive arrangements. Accordingly, reference should be made to the following claims, rather than to the foregoing disclosure, as indicating the scope of such features and implementations.

What is claimed is:

1. A method, comprising:
   determining, using computer hardware executing a computer-based modeling environment, a value of a parameter of a super-sampling rate (SSR) block within a model of a circuit, wherein the SSR block is a multi-channel modeling block and the value indicates a number of a plurality of data channels to be implemented by the SSR block;
   automatically creating, using the computer hardware, a primary input port and a primary output port for the SSR block based on functionality of the SSR block, wherein vector size of the primary input port and the primary output port is specified by the value of the parameter;
   elaborating the SSR block by, at least in part, automatically creating, using the computer hardware, a plurality of scalar instances of the SSR block, a number of the plurality of scalar instances corresponding to the value of the parameter, wherein the plurality of scalar instances are arranged in parallel; and
   parameterizing, using the computer hardware, each scalar instance of the plurality of scalar instances based on a parameterization of the SSR block.

2. The method of claim 1, wherein the SSR block is implemented as a subsystem that contains the plurality of scalar instances.

3. The method of claim 1, further comprising:
   creating a de-multiplexer block for each primary input port, wherein the de-multiplexer block is configured to convey selected samples from vector input data to different ones of the plurality of scalar instances of the SSR block.

4. The method of claim 3, further comprising:
   creating a multiplexer block for each primary output port, wherein the multiplexer block is configured to create vector output data from samples output from each of the plurality of scalar instances of the SSR block.

5. The method of claim 4, further comprising:
   connecting the de-multiplexer block, the multiplexer block, and the plurality of scalar instances of the SSR block together.

6. The method of claim 1, further comprising:
   adding a conditional input port to each of the plurality of scalar instances based on the parameterization of the SSR block.

7. The method of claim 1, further comprising:
   adding a conditional output port to each of the plurality of scalar instances based on the parameterization of the SSR block.

8. The method of claim 1, further comprising:
   determining the value of the parameter of the SSR block automatically based on a data rate of an RF signal to be processed by the model and a clock rate of programmable circuitry of an integrated circuit used to implement the model.

9. The method of claim 8, further comprising:
   iteratively tuning the value of the parameter until timing closure is achieved.

10. The method of claim 1, further comprising:
    generating a circuit design from the model.

11. A system, comprising:
    a processor, in response to executing program code, configured to initiate operations including:
    determining, using a computer-based modeling environment executed by the processor, a value of a parameter of a super-sampling rate (SSR) block within a model of a circuit, wherein the SSR block is a multi-channel modeling block and the value indicates a number of a plurality of data channels of the SSR block;
    automatically creating a primary input port and a primary output port for the SSR block based on functionality of the SSR block, wherein vector size of the primary input port and the primary output port is specified by the value of the parameter;
    elaborating the SSR block by, at least in part, automatically creating a plurality of scalar instances of the SSR block, a number of the plurality of scalar instances corresponding to the value of the parameter, wherein the plurality of scalar instances are arranged in parallel; and
    parameterizing each scalar instance of the plurality of scalar instances based on a parameterization of the SSR block.

12. The system of claim 11, wherein the SSR block is implemented as a subsystem that contains the plurality of scalar instances.

13. The system of claim 11, wherein the processor is configured to initiate operations further comprising:
    creating a de-multiplexer block for each primary input port, wherein the de-multiplexer block is configured to convey selected samples from vector input data to different ones of the plurality of scalar instances of the SSR block.

14. The system of claim 13, wherein the processor is configured to initiate operations further comprising:
    creating a multiplexer block for each primary output port, wherein the multiplexer block is configured to create vector output data from samples output from each of the plurality of scalar instances of the SSR block.

15. The system of claim 14, wherein the processor is configured to initiate operations further comprising:
    connecting the de-multiplexer block, the multiplexer block, and the plurality of scalar instances of the SSR block together.

16. The system of claim 11, wherein the processor is configured to initiate operations further comprising:
    adding a conditional input port to each of the plurality of scalar instances based on the parameterization of the SSR block.

17. The system of claim 11, wherein the processor is configured to initiate operations further comprising:

adding a conditional output port to each of the plurality of scalar instances based on the parameterization of the SSR block.

18. The system of claim 11, wherein the processor is configured to initiate operations further comprising:

determining the value of the parameter of the SSR block automatically based on a data rate of an RF signal to be processed by the model and a clock rate of programmable circuitry of an integrated circuit used to implement the model.

19. The system of claim 11, wherein the processor is configured to initiate operations further comprising:

generating a circuit design implementation of the model.

20. A computer program product, comprising:

a computer readable storage medium having program code stored thereon, wherein the program code is executable by computer hardware to initiate operations including:

determining, using a computer-based modeling environment executed by the computer hardware, a value of a parameter of a super-sampling rate (SSR) block within a model of a circuit, wherein the SSR block is a multi-channel modeling block and the value indicates a number of a plurality of data channels of the SSR block;

automatically creating a primary input port and a primary output port for the SSR block based on functionality of the SSR block, wherein vector size of the primary input port and the primary output port is specified by the value of the parameter;

elaborating the SSR block by, at least in part, automatically creating a plurality of scalar instances of the SSR block, a number of the plurality of scalar instances corresponding to the value of the parameter, wherein the plurality of scalar instances are arranged in parallel; and parameterizing each scalar instance of the plurality of scalar instances based on a parameterization of the SSR block.

* * * * *